United States Patent [19]
Ellis et al.

[11] Patent Number: 5,522,031
[45] Date of Patent: * May 28, 1996

[54] METHOD AND APPARATUS FOR THE ON-LINE RESTORATION OF A DISK IN A RAID-4 OR RAID-5 ARRAY WITH CONCURRENT ACCESS BY APPLICATIONS

[75] Inventors: Robert A. Ellis; Steven J. Malan, both of Woodland Park; Alan Rollow, Colorado Springs; David W. Thiel, Colorado Springs; Richard B. Wells, Colorado Springs, all of Colo.

[73] Assignee: Digital Equipment Corporation, Maynard, Mass.

[ * ] Notice: The portion of the term of this patent subsequent to Jun. 29, 2013, has been disclaimed.

[21] Appl. No.: 85,018

[22] Filed: Jun. 29, 1993

[51] Int. Cl.$^6$ .................................................. G06F 11/00
[52] U.S. Cl. ........................... 395/182.04; 395/182.05
[58] Field of Search ............................. 395/575, 425, 395/182.04, 182.05; 371/10.2, 13, 38, 10.1, 38.1, 40.2

[56] References Cited

U.S. PATENT DOCUMENTS

| | | | |
|---|---|---|---|
| 3,814,922 | 6/1974 | Nibby et al. | 235/153 AM |
| 4,092,732 | 5/1978 | Ouchi | 395/575 |
| 4,434,487 | 2/1984 | Rubinson et al. | 371/10.1 |
| 4,750,106 | 6/1988 | Aiken, Jr. | 371/10.1 |
| 4,775,978 | 10/1988 | Hartness | 371/38.1 |
| 4,870,643 | 9/1989 | Buitman et al. | 371/11.1 |
| 4,914,656 | 4/1990 | Dunphy et al. | 371/10.2 |
| 4,989,205 | 1/1991 | Dunphy et al. | 371/10.1 |
| 4,989,206 | 1/1991 | Dunphy et al. | 371/10.1 |
| 5,369,758 | 11/1994 | Larson et al. | 395/575 |
| 5,390,327 | 2/1995 | Lubbers et al. | 395/575 |

OTHER PUBLICATIONS

*A Case for Redundant Array of Inexpensive Disks* (RAID), David A. Patterson, Garth Gibson, Randy H. Katz, Report No. UCB/CSD 87/391, Dec., 1987, Computer Science Division (EECS), University of California, Berkeley, CA 94720.

*A Case for Redundant Arrays of Inexpensive Disks* (RAID), David A. Patterson, Garth Gibson, and Randy H. Katz, ACM SIGMOD Conference—Jun. 1–3, 1988, Chicago, Illinois.

*Two Papers on RAIDs,* Peter Chen, Garth Gibson, Randy H. Katz, David A. Patterson, Martin Schulze, Report No. UCB/CSD 88/479, Dec., 1988, Computer Science Division (EECS), University of California, Berkeley, CA 94720.

*An Introduction to RAID—Redundant Arrays of Inexpensive Disks,* Peter McLean, Apr. 24, 1991, Digital Equipment Corporation—CX01–2/N26.

*Software and Performance Issues in the Implementation of a RAID Prototype,* Edward K. Lee, Report No. UCB/CSD 90/573, May 1990, Computer Science Division (EECS), University of California, Berkeley, CA 94720.

*A Queuing Analysis of RAID Architectures,* Schenze Chen and Don Towsley, COINS Tech. Report 91–71, Department of Computer and Information Science, University of Massachusetts, Amherst, MA 01003.

*The Digital Guide to RAID Storage Technology,* 1992, Digital Equipment Corporation, pp. 1–10.

*Primary Examiner*—Robert W. Beausoliel, Jr.
*Assistant Examiner*—Ly V. Hua
*Attorney, Agent, or Firm*—Mary M. Steubing; Ronald C. Hudgens

[57] ABSTRACT

A storage system having a plurality of disks arranged in a RAID array with one of said disks being a replacement disk. A method and apparatus for restoring the contents of the replacement disk without interrupting concurrent access to the RAID array. An access request by a user application to a data block in the replacement disk results in regeneration and reconstruction of the accessed data block. In addition, the systematic reconstruction of data or parity blocks not yet accessed by the user application occurs by locating status bits associated with each data and parity block of the new disk.

7 Claims, 7 Drawing Sheets

METHOD AND APPARATUS FOR THE ON-LINE RESTORATION OF A DISK IN A RAID-4 OR RAID-5 ARRAY WITH CONCURRENT ACCESS BY APPLICATIONS

FIELD OF THE INVENTION

Data storage systems having a plurality of disks using a RAID-4 or RAID-5 organization provide enhanced data availability. If one of the disks of the array fails, it can be replaced and the unavailable data stored on the failed disk regenerated and placed on the replacement disk. The present invention is a method and apparatus for on-line reconstruction of a replacement disk in a RAID-4 or RAID-5 array while allowing concurrent, high performance access to the array by application users.

BACKGROUND OF THE INVENTION

RAID (Redundant Array of Independent/Inexpensive Disks) is an organization of data on a plurality of disks which results in enhanced data availability and performance. As is well known, there are several levels of RAID organization with different characteristics that affect performance and availability. One performance enhancing feature of RAID is "striping" which spreads user data across the disks in the array. RAID enhances availability of data through data redundancy.

RAID level 4 (RAID-4) and RAID level 5 (RAID-5) are organizations of data on an array of n+1 disks that provide enhanced performance through the use of striping and enhanced data availability through the association of a parity block with every n data blocks. A block is the smallest unit of data that can be read or written to a disk. Each disk in the RAID array is referred to as a member of the array. Furthermore, while disks are referred to throughout, any equivalent storage media could be used as would be apparent to one of ordinary skill in the field. The data and parity information is distributed over the n+1 disks. Since RAID-4 and RAID-5 are organizations of data in which the data and parity information is distributed over the n+1 disks in the RAID array, if a single disk fails, all of the unavailable data can be reconstructed. RAID-4 is a level of organization of data for a RAID array where data blocks are organized into chunks which are interleaved among the disks and protected by parity and all of the parity is written on a single disk. RAID-5 is a level of organization of data for a RAID array where data blocks are organized into chunks which are interleaved among the disks and protected by parity and the parity information is distributed over all of the disks in the array. A chunk is a group of consecutively numbered blocks that are placed consecutively on a single disk before placing blocks on a different disk. Thus, a chunk is the unit of data interleaving for a RAID array. A strip is the collection of a parity chunk and all of the data chunks that contribute to it.

The contents of each bit of the parity block is the Exclusive-OR of the corresponding bit in each of the n corresponding data blocks. In the event of the failure of a single disk in the array, the data from a given data block on the failed disk is recovered by computing the Exclusive-OR of the contents of the corresponding parity blocks and the n−1 data blocks on the surviving disks that contributed to that parity block. A block or set of blocks is repaired by writing the regenerated data. The regeneration and repair of data for a data block or set of data blocks on a disk in a RAID array is referred to as reconstruction.

As is well known, RAID-4 and RAID-5 organization is a collection of strips, each of which contains a set of blocks per disk, referred to as a chunk. In the RAID-4 organization, all parity chunks are stored on the same disk of the array. In the RAID-5 organization, parity chunks are located on different disks of the array in successive strips.

RAID storage systems can be implemented in hardware or software. In the hardware implementation the RAID algorithms are built into a controller that connects to the computer I/O bus. In the software implementation the RAID algorithms are incorporated into software that runs on the main processor in conjunction with the operating system. In addition, the software implementation can be affected through software running on a well known RAID controller. Both the hardware and software implementations of RAID are well known to those of ordinary skill in the field.

When a disk in the RAID array fails, it can be replaced with a new disk and the contents of the failed disk reconstructed using the standard RAID algorithms from the contents of the other disks. In this manner, the RAID array with the replacement disk is restored to its fully redundant state without the loss of application data.

To restore a failed disk of a RAID-4 or RAID-5 array the appropriate contents of the replacement disk must be computed and written to the replacement disk. The reconstruction is easy to implement if concurrent application access to the array is inhibited. If concurrent application access to the array is permitted during reconstruction, the read and write operations from the user must be performed in a manner that recognizes the state and operation of the restoration process. In known storage systems using RAID organization on-line reconstruction of a replacement disk is accomplished by using a "fence" that separates the portion of the disk that has been restored from the part that has not been restored. The read and write operations being performed differently depending upon which "side" of the "fence" they address. As restoration proceeds throughout the array the "fence" moves. The use of "fences" to effect on-line restoration requires complex programming and/or circuitry and accordingly increases the cost of the storage system. Thus, it is desirable to have an on-line restoration of a replacement disk to a RAID array while allowing high performance concurrent application access to the array.

SUMMARY OF THE INVENTION

The present invention is a process of reconstructing on-line the data and parity blocks of a failed or unavailable disk of a RAID-4 or RAID-5 array. Accordingly, during reconstruction high performance concurrent access to the array by applications continues.

RAID-4 and RAID-5 are closely related organizations of an array of disks that provide enhanced performance through the use of striping and enhanced data availability through the association of a "parity block" with every n data blocks. The data and parity information is distributed over n+1 disks so that if a single disk fails, all of the data can be recovered. RAID-4 is a level of organization of data for a RAID array where data blocks are organized into chunks which are interleaved among the disks and protected by parity and all of the parity is written on a single disk. RAID-5 is a level of organization of data for a RAID array where data blocks are organized into chunks which are interleaved among the disks and protected by parity and the parity is distributed over all of the disks in the array. In both RAID-4 and RAID-5 the ensemble or array of n+1 disks appears to the user as a single more highly available virtual disk. A chunk is a group of consecutively numbered blocks that are placed consecutively on a single disk before placing blocks on a different disk. Thus, a chunk is the unit of data interleaving for a RAID array.

The contents of each bit of the parity block is the Exclusive-OR of the corresponding bit in each of the n corresponding data blocks. In the event of a failure of a single disk in the array, the data information from a given data block on the failed disk is recovered by computing the Exclusive-OR of the contents of the corresponding parity block and the n−1 data blocks on the surviving disks that contributed to that parity block. A block or set of blocks is repaired by writing the regenerated data. The regeneration and repair of data for a data block or set of data blocks onto a replacement disk in a RAID array is referred to as reconstruction. The calculation and writing of the parity blocks on the replacement disk is included within the meaning of reconstruction.

The process of the present invention restores the appropriate contents of a replacement disk without interrupting concurrent access to the RAID array. A small number of blocks of each disk are set aside for status bits. In the preferred embodiment, one status bit corresponds to each data or parity block. The status bit indicates whether the corresponding block or group of blocks contains "valid" information or "invalid" (e.g. meaningless) information. In an alternative embodiment, one status bit corresponds to a group of parity or data blocks. In other alternatives, the status information can be encoded or mapped in different ways to represent the parity or data blocks which may contain invalid information.

In order to begin the reconstruction of the unavailable information on a failed disk, the replacement disk is prepared by setting the status bit for every data and parity block, located on the replacement disk, to a first or set state indicating that the block contains "invalid" or meaningless information. Every block whose status bit is set to the invalid state is treated as if it cannot be read. The replacement disk is then added to the RAID array as a full member. All read and write operations on the array are performed according to the normal methods for performing read and write operations and for managing read and write failures.

Whenever data is written to the replacement disk, the status bits for the corresponding blocks are set to the valid state. Whenever data which is to be read from the replacement disk is unavailable, the data from the unavailable block is regenerated by computing the Exclusive-OR of the contents of the corresponding parity block and the n−1 data blocks on the remaining disks in the array that contributed to that parity block. The regenerated data is written to the replacement disk and the status bit is set to the valid state. During the course of normal application access to the array, the most active portions of the replacement disk are reconstructed before other portions of the replacement disk. In addition to the reconstruction that is driven by application access to the array, the process of the present invention includes a deliberate reconstruction activity that computes the contents for those blocks that have the status bit set to the "invalid" state, writes this data to the replacement disk and sets the status bit to the valid state. The intensity with which this process is pursued relative to application requests determines the duration of the reconstruction period. The status bits are stored on the same disk as the blocks to which they relate and also in a cache memory which improves access time.

BRIEF DESCRIPTION OF THE DRAWINGS

Other advantages of the invention will become apparent upon reading the following detailed description and upon reference to the accompanying drawings, in which.

Figure 1:
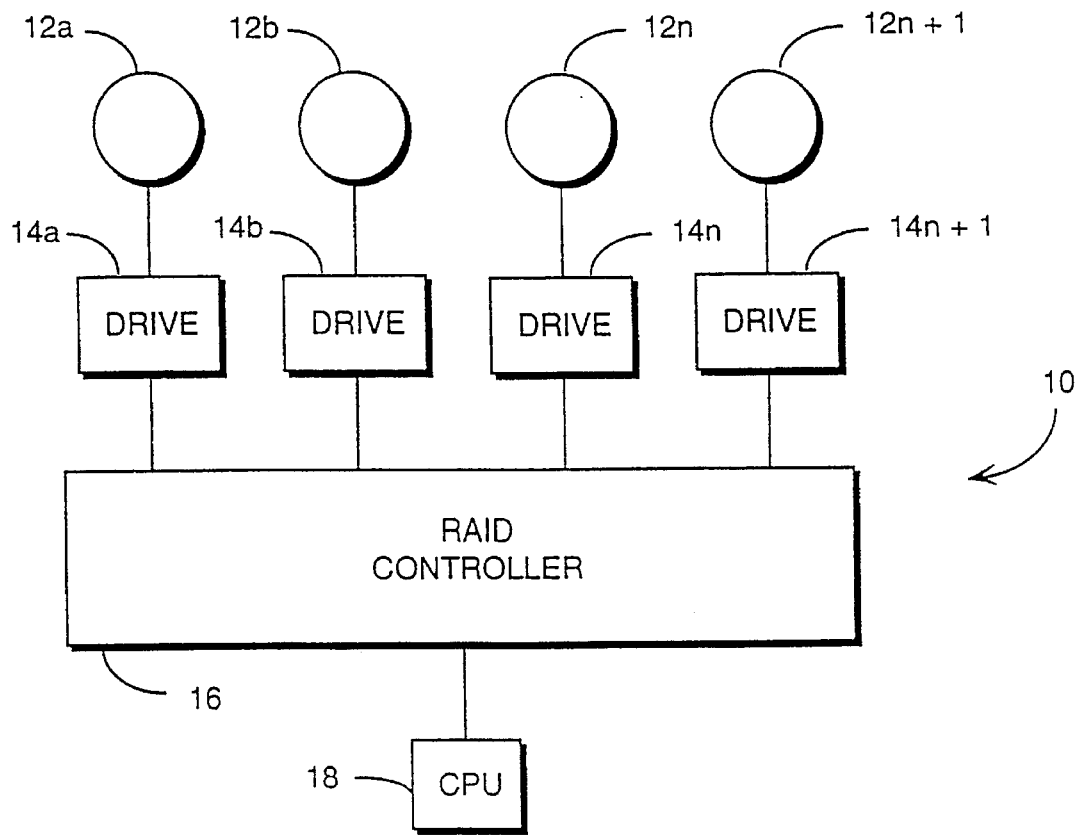
FIG. 1 is a data storage system using a RAID organization according to the present invention.

While the invention is susceptible to various modifications and alternative forms, specific embodiments thereof have been shown by way of example in the drawings and will herein be described in detail. It should be understood, however, that the invention is not intended to be limited to the particular forms disclosed. On the contrary, the applicant's intention is to cover all modifications, equivalents, and alternatives falling within the spirit and scope of the invention as defined by the appended claims.

DETAILED DESCRIPTION OF THE DRAWINGS

FIG. 1 is an illustration of a storage system 10 in which an array of n+1 disks 12 and associated drives 14 are connected to a RAID controller 16. A user, such as CPU 18, gains access to the n+1 disks 12 via normal read and write commands. The n+1 disks 12 are arranged into either a RAID-4 or RAID-5 organization based upon the selection of the well known RAID algorithms implemented in the RAID controller 16. The present invention is also usable with a host based software implementation of a RAID controller.

RAID-4 and RAID-5 are closely related organizations of the n+1 disks 12 that provide enhanced performance through use of striping and enhanced availability through the association of a parity block with every n data blocks. The data and parity information is distributed over the array of n+1 disks 12 so that if any single disk fails or otherwise becomes unavailable all of the data and/or parity information on the unavailable disk can be reconstructed. In the RAID-4 organization, all parity data is on a single disk and in the RAID-5 organization, the parity information is distributed over all of the disks in the array.

All access to the array of n+1 disks 12 is through the RAID controller 16 which is connected to a user such as CPU 18. A single CPU is shown but using a plurality of CPU's is well within the ability of someone of ordinary skill in the field. The RAID controller 16 contains the standard RAID algorithms and is well known to one of ordinary skill in the art.

The array of n+1 disks 12 appears as a single, more highly available virtual disk to a user. The contents of each bit of the parity block is the Exclusive-OR of the corresponding bit in each of the n corresponding data blocks. As is well known, other error correction codes can be used to establish the mathematical relationship between the data and parity information. In the event of the failure or unavailability of a single disk in the array of n+1 disks 12, the data from a given data block on the unavailable disk is regenerated by computing the Exclusive-OR of the contents of the corresponding parity block and the n−1 data blocks on the remaining disks in the array that contributed to that parity block. The unavailable data block, if possible, is repaired by writing the regenerated data. In this manner the entire unavailable disk is reconstructed by regenerating data and repairing data blocks. Of course, the unavailable disk can be removed and a replacement disk substituted and the regenerated data is then written on the replacement disk to bring the RAID array back to fully redundant operation.

Figure 2:
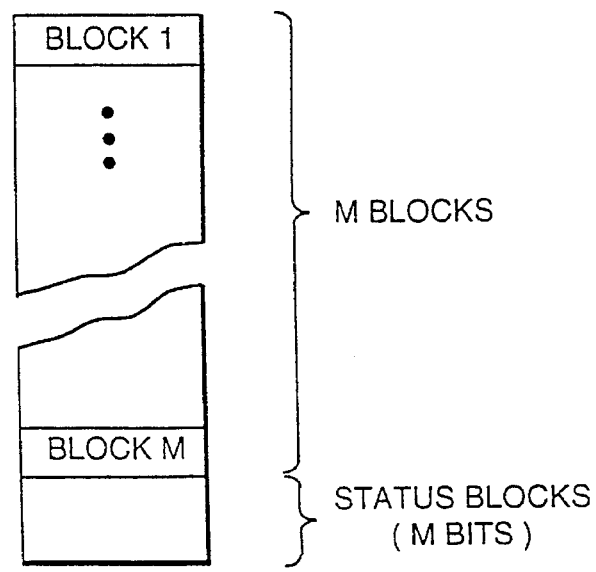
FIG. 2 is an illustration of the block structure of a disk in the RAID array including the status bits of the present invention.

FIG. 2 is one disk of a RAID array illustrated as a linear space of blocks. If there are M blocks on the disk for data and parity and if RAID-5 organization is being used then, enough blocks must be set aside to accommodate M status bits. While the blocks holding the status bits are illustrated at the last blocks of the disk, the status blocks can be located anywhere on the disk without departing from the present invention.

Figure 3:
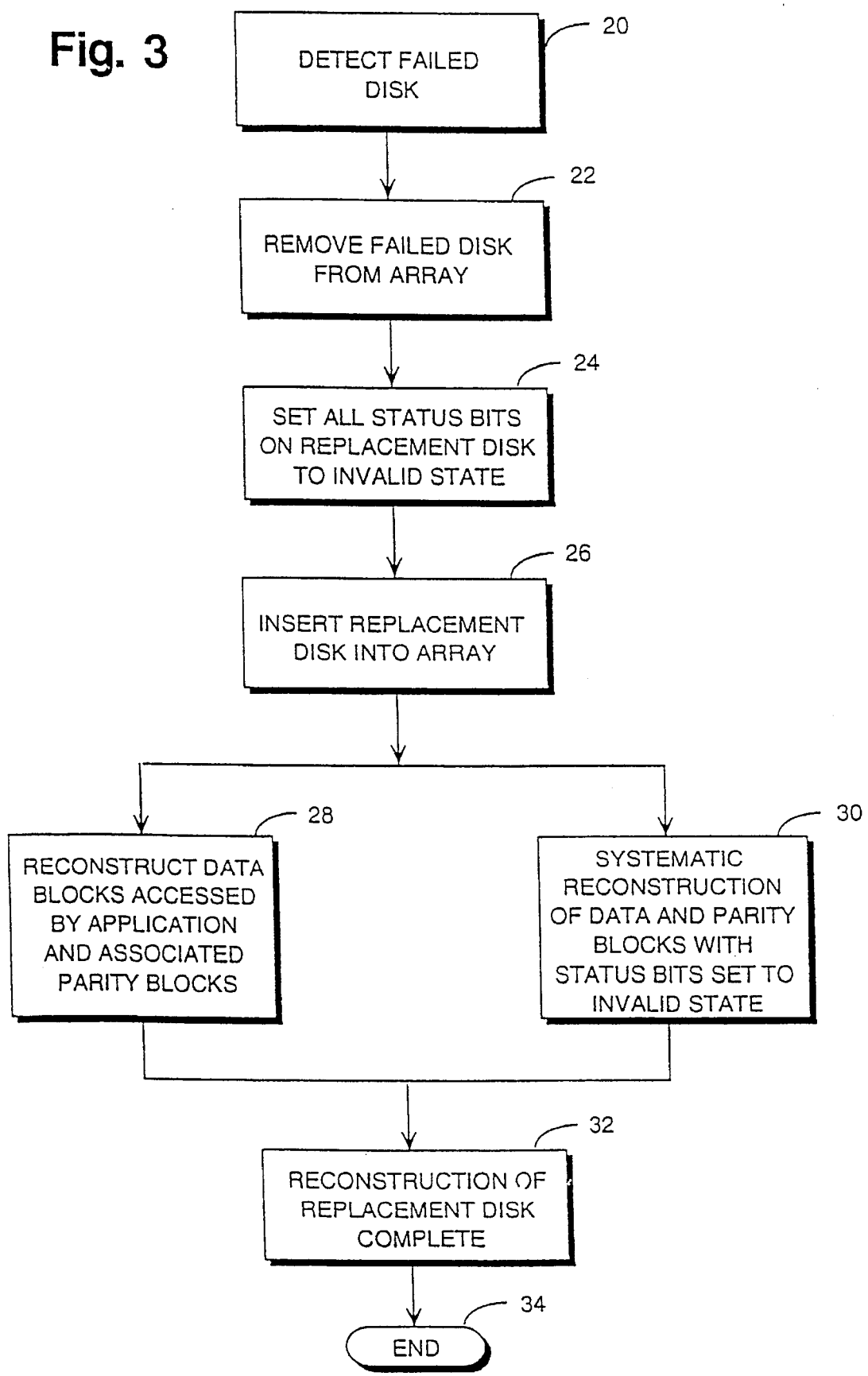
FIG. 3 is a flow chart illustrating the process of restoring a replacement disk in a RAID array according to the present invention.

FIG. 3 is a flow chart illustration of the process of restoring a failed disk in a RAID-4 or RAID-5 array while allowing concurrent application access to the array. The occurrence of a failed or unreadable disk is detected at step 20. To begin the reconstruction of a failed disk, the old disk is removed at step 22. Next the status bits for every data or parity block on the replacement disk is set to the invalid state at step 24 and the replacement inserted into the array at step 26. In the course of performing read and write operations on the array, whenever meaningful data or parity is written to the replacement disk or regenerated due to a read operation and written to the replacement disk, the status bit is subsequently set to the valid state. This process is fully described in co-pending application titled Method and Apparatus for Preventing the Use of Corrupt Data in a Multiple Disk RAID Organized Storage System, filed on the same date as the subject application and assigned to the same assignee, incorporated herein by reference and in addition described with reference to FIGS. 5 through 8. Thus, portions of the replacement disk are restored during the course of normal application access to the array at step 28 but the full restoration of the replacement may not be driven to completion in a timely manner by application access to the array.

Thus, an important aspect of the present invention is that those parts of the array that are accessed by applications are reconstructed first. For workloads that have significant locality of access the performance characteristics of the array rapidly take on the characteristics of a fully redundant array. When data on the replacement disk is first accessed, the detection of the invalid status bit causes the data to be regenerated from the remaining disks, returned to the application and written to the replacement disk with the subsequent setting of the status bit to the valid state. When data within a strip whose parity data is stored on the replacement disk is written, the well known RAID algorithms for performing the write will either:

a) write meaningful parity information to the replacement disk without ever reading the parity data; or b) read the meaningless parity information from the replacement disk, detect the invalid status bit and either revert to the algorithm in paragraph a which results in new parity being written or leave the status bit set to the invalid state.

Thus, access to the array tends to cause effective reconstruction of the replacement disk.

The present invention, in addition to the reconstruction that is driven by application access to the array, uses a deliberate reconstruction process that computes the meaningful contents for those blocks that have the status bit set to the invalid state from the other disks in the array, writes the computed data or parity to the replacement disk and subsequently sets the status bit to the valid state at step 30. The intensity with which this process is pursued relative to application requests determines the duration of the reconstruction period and also the degradation of performance seen by application requests due to contention for the disks caused by the deliberate reconstruction activity. Thus, the intensity of the deliberate reconstruction activity is a policy parameter that flexibly chooses between rapid restoration of redundancy and high performance application access to the array while the reconstruction is incomplete. The reconstruction caused by application access to the array together with the systematic reconstruction of data blocks having the status bit set to the invalid state combine to fully reconstruct the replacement disk at step 32 and the process ends at step 34.

Figure 4:
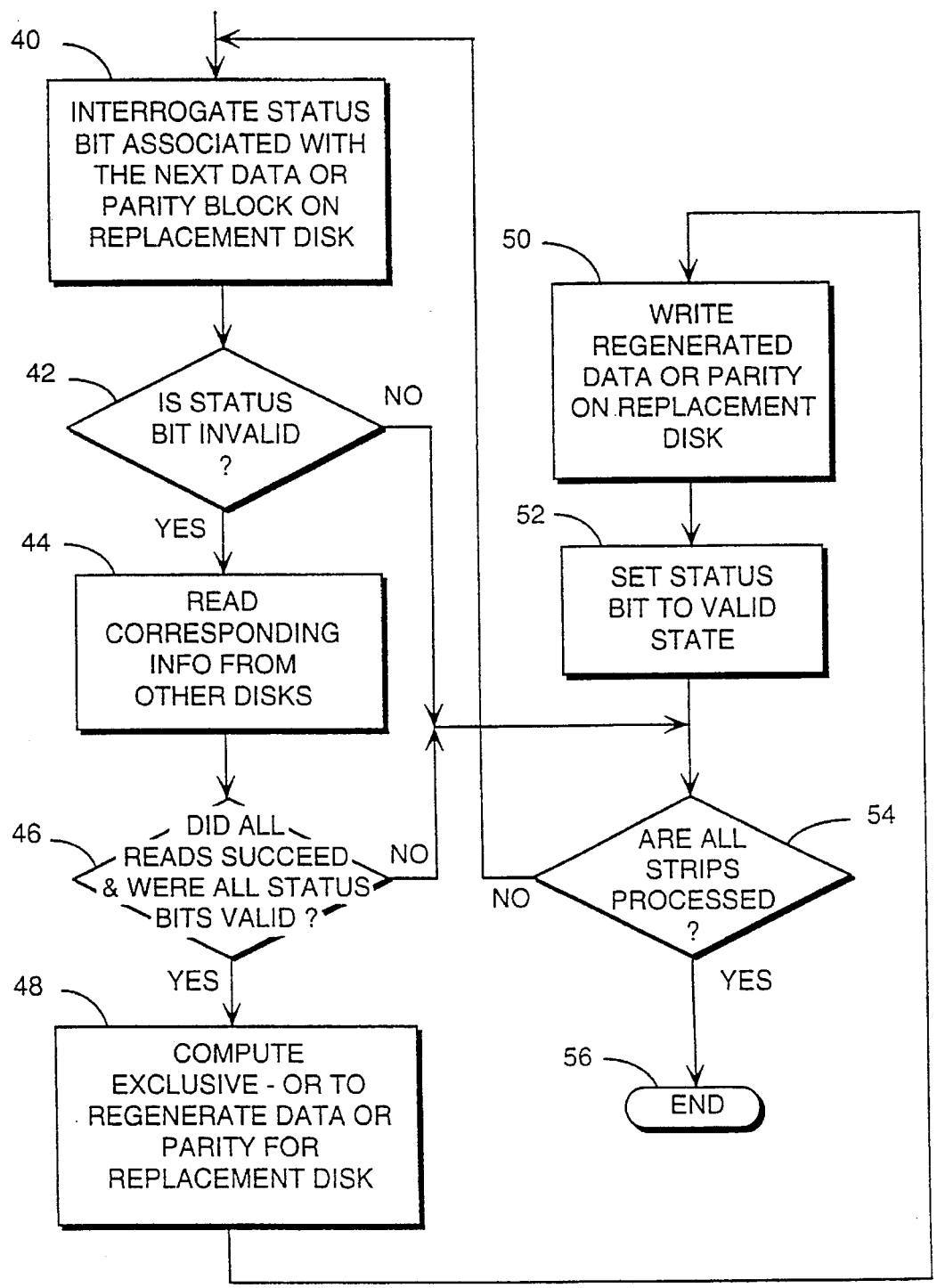
FIG. 4 is a flow chart illustrating the process of systematic regeneration according to the present invention.

FIG. 4 is a flow chart of the systematic reconstruction of the data and parity blocks of the replacement disk that have status blocks set to the invalid state shown at step 30 of FIG. 3. The deliberate reconstruction activity is performed by interrogating the status bit associated with the next data or parity block on the replacement disk at step 40. The process is described as a block by block operation for the sake of clarity of description. It is well known to one of ordinary skill in the art that groups of blocks can more practically be processed. The process determines if the status bit is in the invalid or valid state at step 42. If the status bit is set to the invalid state then the corresponding information from the other disks of the array is read at step 44. If all read operations succeed and all status bits associated with the blocks read are in the valid state as determined at step 46, then the process proceeds. At step 48 the Exclusive-OR of the information from the other disks is computed. Next, at step 50 the results are written to the reconstructing or replacement disk. Thereafter, at step 52, the status bit of the written block is set to the valid state. Thereafter, at step 54, determining if all of the strips of the replacement disk have been processed. If all of the strips have been processed, then the process ends at step 56. But if all the strips have not been processed, then the process loops back to step 40 to interrogate the next status bit. If the status bit is valid as determined at step 42, then the process proceeds to step 54 to determine if all of the strips of the replacement disk are processed as described above. If any of the read operations do not succeed or if any of the status bits are in the invalid state as determined at step 46, then the process proceeds to step 54 to determine if all of the strips of the replacement disk are processed as described above. If, in the course of reconstruction, some part of some disk cannot be read, then the corresponding blocks of the replacement disk cannot be regenerated and therefore the status of those blocks remains invalid.

In the preferred embodiment, the status bits for the replacement disk are included on a small number of blocks and also stored in a cache memory. The cache memory can be managed in any well known manner. The use of the cache memory improves access time to the status bits.

Figure 5:
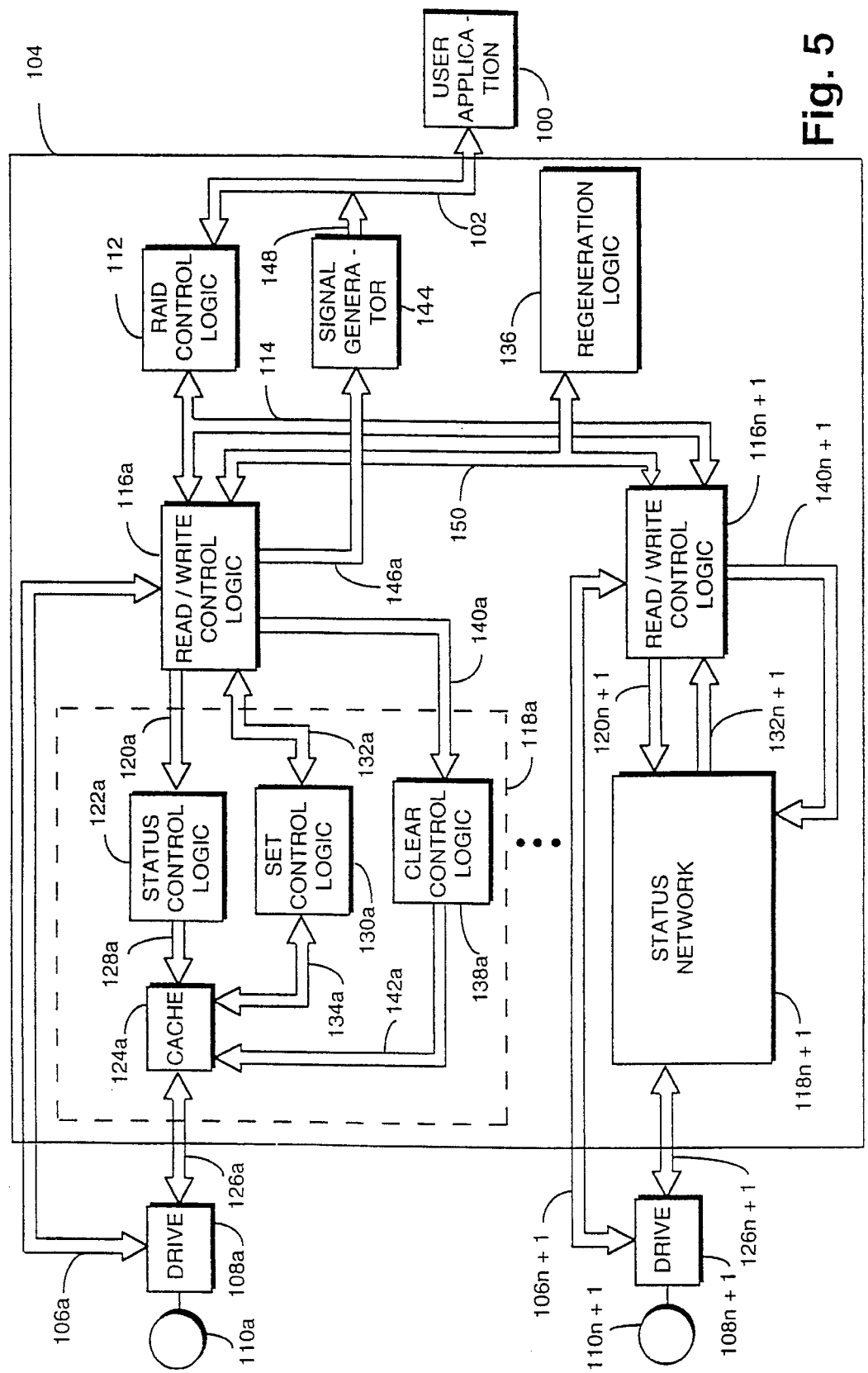
FIG. 5 is an illustration of a hardware implementation of the present invention.

FIG. 5 is a block diagram of a data storage system which uses a high performance volatile memory to store the status bits for each disk in the RAID array. A user application 100 sends a read or write command via bus 102 to the RAID controller 104. The RAID controller 104 sends control signals and data over control/data buses 106a through 106n+1 to a plurality of disk drives 108a through 108n+1 to position the read/write heads over the proper portion of the plurality of disks 110a through 110n+1. Furthermore, as is well understood by one of ordinary skill in the field, in a read operation the data read from the disks 110a through 110n+1 is passed over control/data buses 106a through 106n+1 through the RAID controller 104 and over request/data bus 102 to the user application 100.

A read request or command from user application 100 is sent via bus 102 to the RAID controller 104. The RAID control logic 112 identifies the data block affected and sends a signal to the appropriate read/write control logic 116a through 116n+1. The appropriate disk drive 108a through 108n+1 reads the affected data blocks from disks 110a through 110n+1 as is well known to those of ordinary skill in the field. Each control logic 116a through 116n+1 comprises a plurality of logic gates arranged to provide the described outputs based upon the various inputs and the specific arrangement of logic gates is within the ability of one of ordinary skill in the field and a matter of design choice and is therefore not described further herein. Each read/write control logic 116a through 116n+1 is connected to a status network 118a through 118n+1. Each status network is identical and therefore only the status network 118a connected to read/write logic 116a is described in detail. A control signal identifying the data blocks to be read is sent over bus 120a to the status logic control 122a which maps the identified data blocks to the appropriate address in cache 124a. If all of the status bits are clear the set control logic 130a signals read/write control logic 116a via bus 132a mid the read data is sent to the user application as is well known in the field. If any one of the status bits is set, then set control logic 130a sends a signal to read/write control logic 116a and regeneration of the data block in the Exclusive-OR regeneration logic 136 is undertaken as is well known in the field. If one of the data blocks sought to be read by the read/write control logic 116a is unavailable, or if the read operation does not succeed, the read/write control logic sends a signal over bus 150 to the Exclusive-OR regeneration logic 136 which attempts to regenerate the unavailable data as is well known in the field. If all of the data and parity blocks needed to accomplish the regeneration are available, and all of their status bits are clear, the regenerated data is sent to the user application 100 together with the other read data. In addition, the regenerated data block is written to disk in accord with standard RAID procedures and read/write control logic 116a sends a signal over bus 140a to clear control logic 138a which sends a signal over bus 142a to cache 124a to clear the status bit for the regenerated data block. The status bit for the regenerated and repaired data block is also cleared on disk. If any of the data and parity blocks needed for the regeneration is not available, or any of their status bits is set, the read/write control logic 116a sends a signal to generator 144 which sends an error signal via 148 to the application user 100.

The status control logic 122a, the set control logic 130a and the clear control logic 138a comprise a plurality of logic gates that provide the described output based upon the various inputs as is within the ability of one of ordinary skill in the field and the particular arrangement of logic gates is a design choice and therefore not described further herein.

If a write request from user application 100 is received over request/data bus 102 by the RAID controller 104, the standard RAID control logic 112 receives the write request or command and determines the data blocks affected by the write operation. A write request issued by a user application will be expanded into several disk read and write requests by the RAID control logic 112 according to the well known RAID algorithms (e.g., to read and write the data block, and read and write the parity block). The RAID logic to perform this function is well known to those of ordinary skill in the field. The following describes the mechanism to perform each actual disk write request issued from the RAID control logic 112; of course, this may be only one of several read and write operations which are needed in order to process a single user write request.

Each disk write request from the RAID control logic 112 is sent over control/data bus 114 to the read/write control logic 116a through 116n+1. Each read/write control logic 116a through 116n+1 is connected to a status network 118a through 118n+1. Each status network is identical and therefore only the status network 118a connected to read/write control logic 116a is described in detail. A control signal identifying the data blocks affected by the write operation is sent over bus 120a to the status logic control 122a which maps the identified affected data blocks to the appropriate address in cache 124a. The status bits are stored on disk as described above and also stored in a cache for easy access. Cache 124a is connected over bus 126a to drive 108a to send and receive data concerning the state of the status bits on disk 110a in a manner well known to those of ordinary skill in the field. Of course, each time the state of the status bits in cache 124a are changed the status bits on disk 110a must be updated and the reverse is also necessary. The status logic control 122a is connected to the cache 124a via bus 128a to identify the affected data blocks. The read/write control logic 116a is connected to set control logic 130a via bus 132a to indicate that the operation being performed is a write or a read. The set logic control 130a is connected to the cache 124a via bus 134a. If the status bits for the affected data blocks are clear a signal is sent from the set logic control 130a via bus 132a to read/write control logic 116a. New party data is calculated at Exclusive-OR regeneration logic 136, written at the appropriate block on the disks 110 and new data from the user application 100 is written at the appropriate data blocks of the disk 110a and read/write control logic 116a sends a signal to signal generator 144 which sends a write success signal via bus 148 to application user 100, as is well known to those of ordinary skill in the field. If the status bit for one of the affected data blocks is set, set control logic 130a sends a signal over bus 132a to the read/write control logic 116a. The new data from the user application 100 is now written at the appropriate data blocks, of the disk 110a as described above. Then read/write control logic 116a sends a signal to clear logic control 138a via bus 140a. The clear logic control 138a sends a signal via bus 142a to cache 124a to clear the status bits for the affected data blocks and the status bit on drive 108a is also cleared. If the write operation to clear the status bits on disk succeeded, read/write control logic 116a sends a signal to signal generator 144 which sends a write success signal to application 100 and the write operation ends successfully. If the clearing of the status bits on disk failed, the read/write control logic 116a sends a signal to request status generator 144 via bus 146 and generator 146 sends an error or write failure signal via bus 148 to the application user 100.

During the systematic reconstruction process, read/write control logic 116a, assuming that disk 110a is the replacement disk, sends a signal over bus 120a to a status control logic 122a to interrogate cache 124a via bus 128a for the next status bit that is in the set state. When a status bit in cache 124a is located in the set state a signal is sent over bus 134a to set control logic 130a which sends a signal to read/write control logic 116a identifying the block having the status bit set. The read/write control logic 116a sends a signal to RAID control logic 112 via bus 114. The RAID control logic 112 sends signals via bus 114 to the appropriate read/write control logic 116b through 116n+1 to read the corresponding blocks from disks 110b through 110n+1 and the corresponding status bits in cache 124b through 124n+1. If all of the needed blocks are available and the associated status bits are clear or in the valid state, the read data and parity is sent to Exclusive-OR regeneration logic 136 and the data or parity for the block on disk 110a is computed in a manner well known to those of ordinary skill in the field. The regenerated data is sent to read/write control logic 116a which writes the new data to the disk 110a. Then read/write control logic 116a sends a signal to clear logic control 138a via bus 140a. The clear logic control 138a sends a signal via bus 142a to cache 124a to clear the status bit for the block and the corresponding status bit on disk is also cleared. This process of systematic regeneration is continued until all blocks of disk 110a are reconstructed or determined as not capable of reconstruction. If all of the needed blocks are not available, or any of the associated status bits are in the invalid state, the Exclusive-OR regeneration logic 136 sends a signal to read/write control logic 116a and another block with the status bit set is located as described above.

As referred to above with reference to FIG. 3, when performing read and write operations on the array, whenever meaningful data or parity is written to the replacement disk or regenerated due to a read operation, the status bit is subsequently set to the valid state. This process is a logging process and apparatus which associates one bit with each individual block or groups of blocks in each disk of the RAID array and places that bit in a first or set state when the data in the block is corrupt, meaningless or invalid and places that bit in a second or clear state when the data in the block is valid or accurate. The data in the block is meaningless, corrupt or invalid if it results from a regeneration operation that was unsuccessful or a write operation that was unsuccessful. The process prevents the corrupt data from being sent to an application user who initiates a read command or from being used in computations internal to the functioning of the, array. A sufficient number of blocks on each member of the RAID array are allocated to contain one bit for every data or parity block or group of data or parity blocks. Since a common block size is 4096 bits, this represents an overhead of one part in 4096. In the preferred embodiment, each bit describes one block on the disk. If the bit is in the set state, the data on the associated block is invalid. If the bit is in the clear state, the data on the associated block is valid. In an alternative embodiment, one status bit corresponds to a group of parity or data blocks. In other alternatives, the status information can be encoded or mapped in different ways to represent the parity or data blocks which may contain invalid information.

Figure 6:
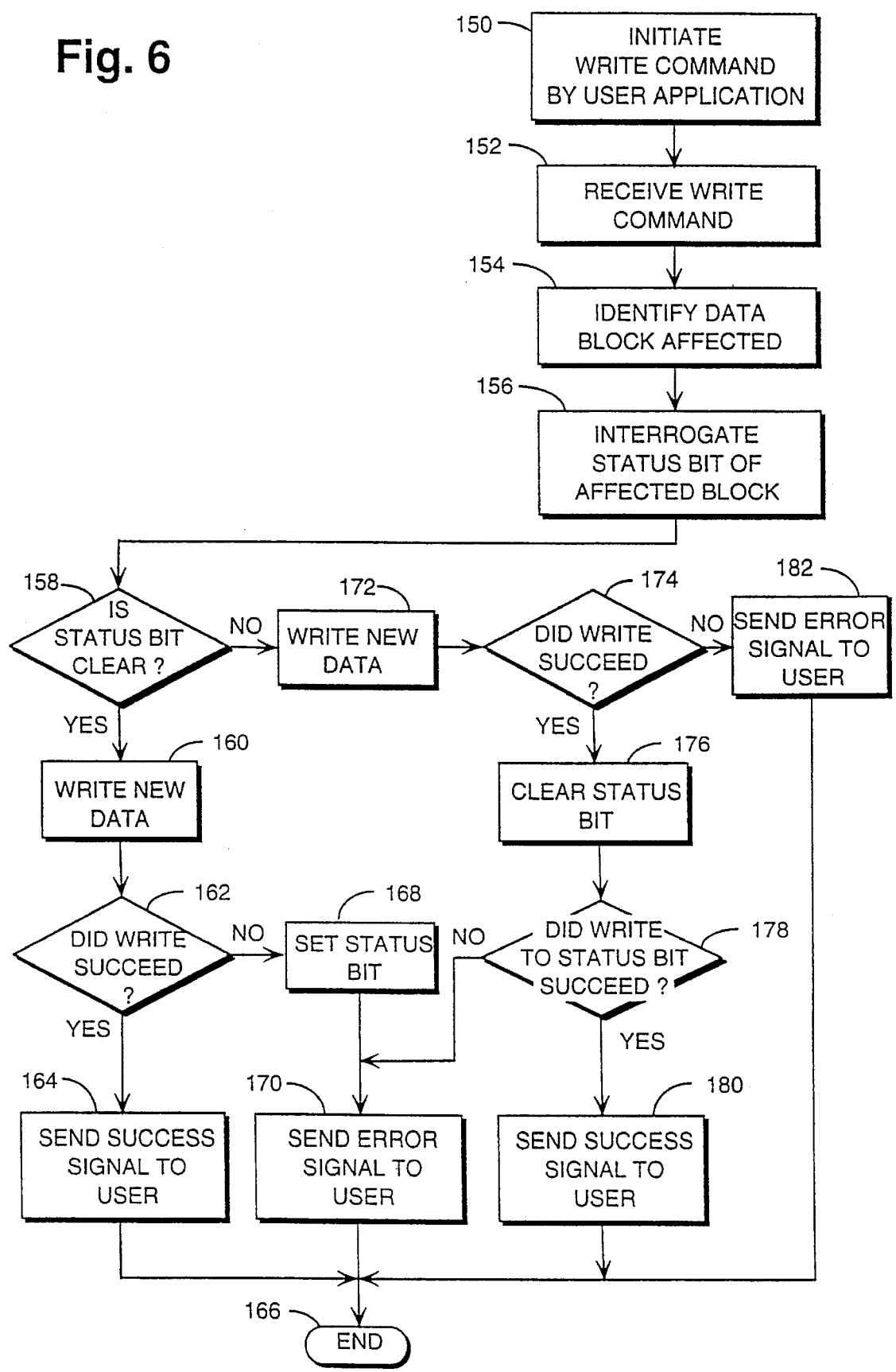
FIG. 6 is a flow chart illustrating a write operation and the use of status bits to prevent the use of corrupt data.

FIG. 6 is a flow chart illustrating a write operation initiated by an application user represented at step 150. The write command is received at step 152 and the affected data block identified at step 154. The status bit of each affected data block is accessed at step 156. If a status bit is clear as determined at step 158, the new data is written at step 160. If the write operation was successful as determined at step 162, then a success signal is sent to the user at step 164 and the process successfully ends at step 166. If the write operation was not successful as determined at step 162, the status bit is set at step 168 and an error signal is sent to the user at step 170 and the process unsuccessfully ends at step 166.

If the status bit is not clear as determined at step 158, the new data is written at step 172. If the write operation was successful as determined at step 174, then the status bit is placed in the clear state at step 176. Of course, setting or clearing the status bit requires a disk write operation. If the write to the status bit was successful as determined at step 178, then a success signal is sent to the user at step 180 and the process successfully ends at step 166. If the write to the status bit was unsuccessful as determined at step 178, then an error signal is sent to the user at step 170 and the process unsuccessfully ends at step 166. Finally, if the new data write operation was not successful as determined at step 174, then at step 182 an error signal is sent to the user and the process unsuccessfully ends at step 166. In this manner, a data block that contains meaningless data is flagged or identified and will not be used in subsequent read or regeneration operations to that block as described hereinafter.

Figure 7:
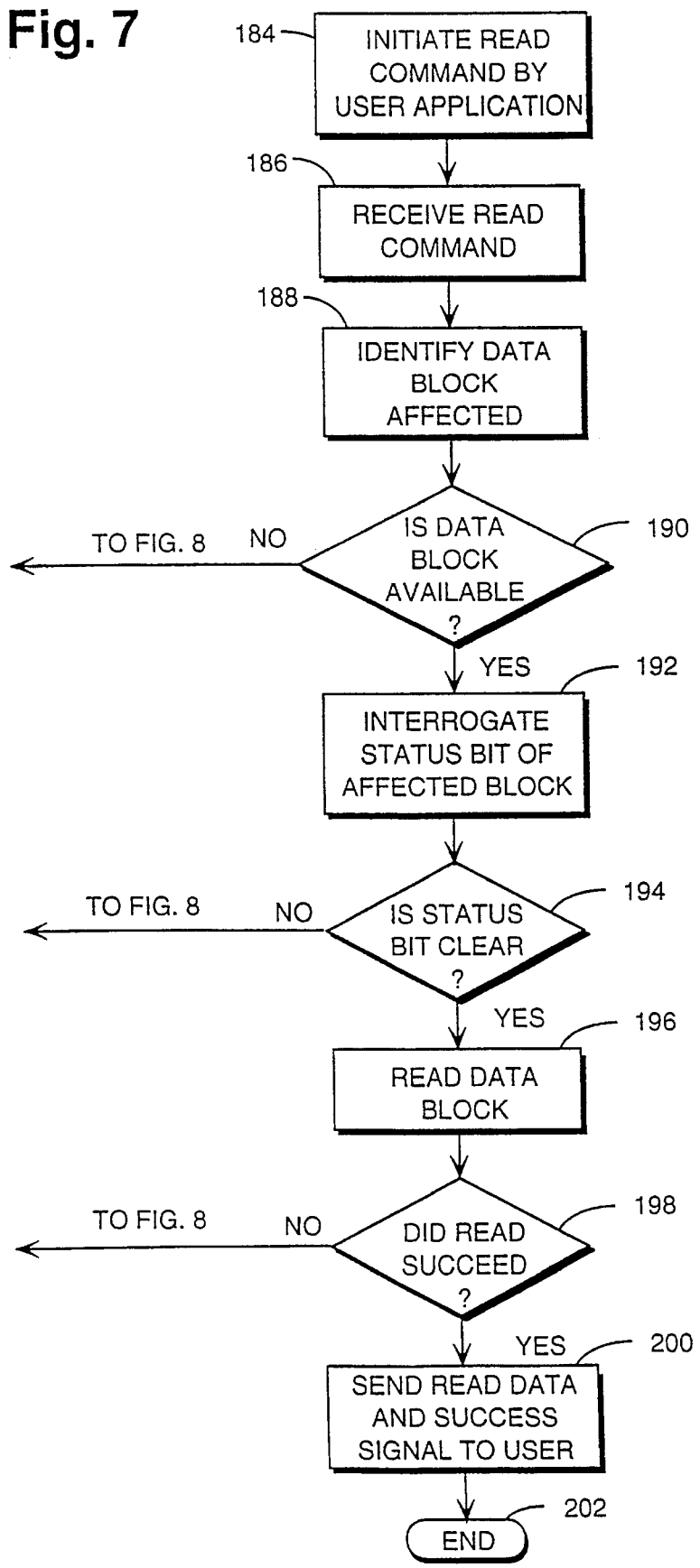
FIG. 7 is a flow chart illustrating a read operation and the use of status bits to prevent the use of corrupt data.
Figure 8:
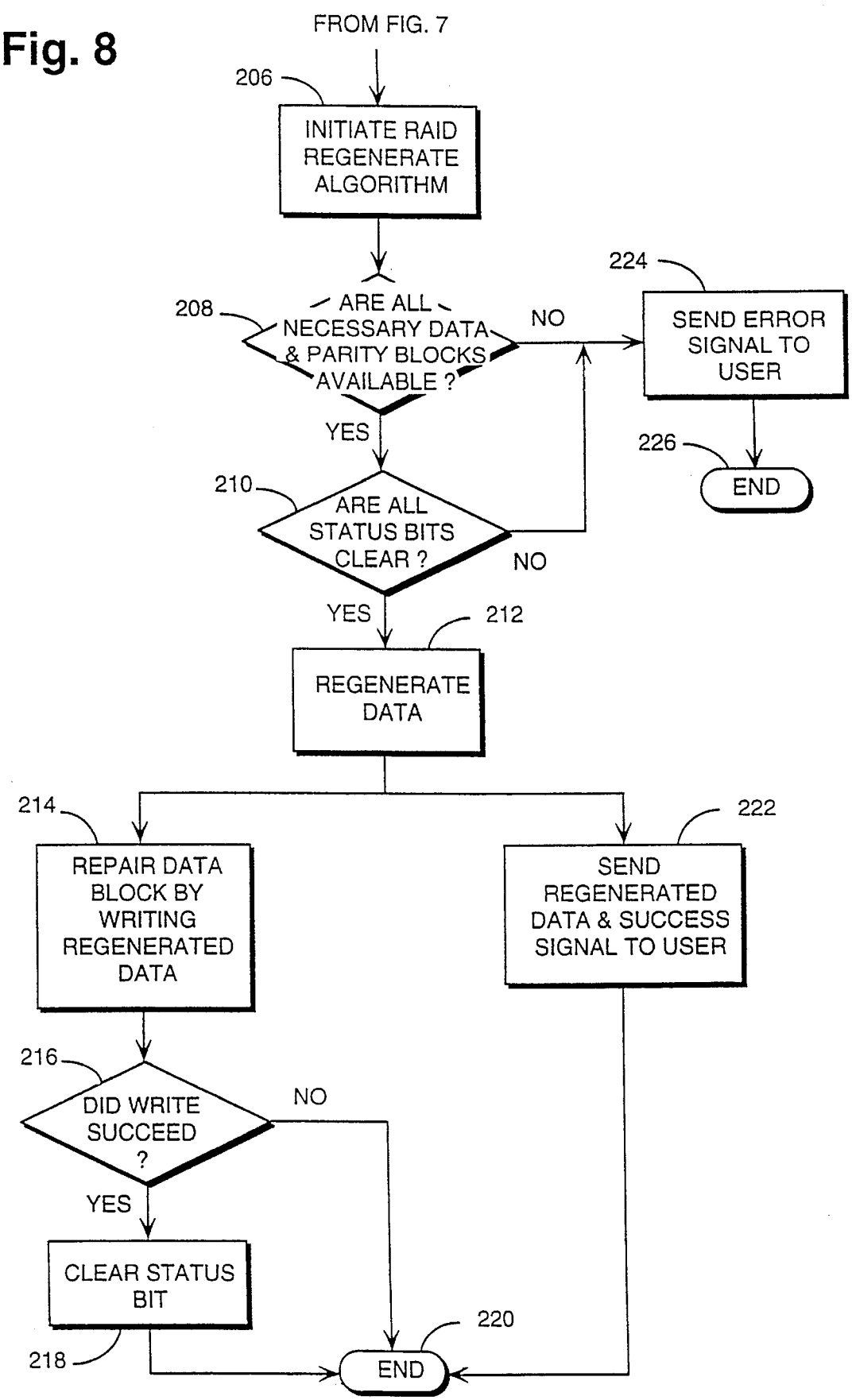
FIG. 8 is a flow chart illustrating the regeneration of data for a failed disk and the use of status bits to prevent the use of corrupt data.

FIG. 7 is a flow chart illustrating a read operations initiated by the application user represented at step 184. The read command is received at step 186 and the affected or targeted data block is identified at step 188. If the identified data block to be read is unavailable as determined at step 190, then the regeneration procedure of FIG. 8 is initiated. If the identified data block is available as determined at step 190, then the status bit is interrogated at step 192. If the status bit is set as determined at step 194, then the process proceeds to FIG. 8. If the identified data block is available and the status bit is clear as determined at step 194, then the identified data block contains valid data and the identified data block is read at step 196. If the read was successful as determine at step 198, then at step 200 the read data and a success signal is sent to the user and the process successfully ends at step 202. If the read operation was not successful as determined at step 198, then the process proceeds to FIG. 8.

FIG. 8 is a flow chart illustrating the regeneration of data using the standard RAID algorithms and the use of the status bits of the process. The sequence of steps in FIG. 8 illustrate the situation when one of the data blocks identified or targeted by the read request of FIG. 7 is unavailable as determined at step 190 or the status bit is set as determined at step 194 or the read operation is unsuccessful as determined at step 198. At step 206 the RAID algorithms for regeneration of unavailable data begin. In order to regenerate, it is necessary that the Exclusive-OR function be used with the other data blocks and the parity block to which those data blocks contributed. At step 208, the availability of the necessary data blocks and parity block is determined and at step 210 the status bits of these data blocks and parity block are checked to verify that the data is meaningful or valid. if all of the data blocks and the parity block are present and the status bits are clear, then the regeneration is completed at step 212. Next, at step 214, the unavailable data block is repaired by writing to it the regenerated data. If the write succeeds as determined at step 216, the status bit is cleared at step 218 and the process successfully ends as step 220. Of course, setting or clearing the status bit require a disk write operation. If the write is not successful as determined at step 216, the process ends at step 220. In addition, since the user is typically not concerned about the success of the repair of the data block, the request data including regenerated data and a read success signal is sent to the user at step 222 and the process successfully ends at step 220. If at step 208 one of the data blocks or parity block necessary for regeneration is unavailable or unreadable, for example because of an electrical, magnetic or mechanical anomaly affecting that portion of the data, or because any of the status bits indicate that the data is invalid at step 210, an error signal is sent to the user application at step 224 and the read operation ends unsuccessfully at 226.

The logging process and apparatus described above in FIGS. 6 through 8 identifies regenerated or written data as meaningless or corrupt by setting a bit associated with the block to a first state and sends an error signal in response to subsequent read operations to that data block thereby preventing corrupt data from being used. The process prevents the meaningless data identified by the set bit associated with it from being provided to a user application either after regeneration or as a result of a subsequent read operation and prevents the meaningless data from being used in any computations internal to the functioning of the array. Thus, the use of undetected corrupt data is prevented. The, status bits are stored on the same disk as the associated blocks and also in a cache for quick access. The flow charts of FIGS. 6 through 8, as would be understood by someone of ordinary skill in the field, are equally applicable to alternative embodiments in which the status information is encoded or mapped in different ways to represent the blocks which may contain invalid information.

The on-line reconstruction of a replacement or failed disk in a RAID-4 or RAID-5 array while allowing concurrent, high performance access to the array by user or client applications has been described. The blocks of the replacement disk that are accessed by user applications are reconstructed first. Thus, for workloads that have significant locality of access, the performance characteristics of the array rapidly take on the characteristics of a fully redundant array. In addition to the reconstruction due to application access to the array, there is a systematic deliberate reconstruction process that regenerates blocks in the replacement disk that have a status bit set to a first state until the entire replacement disk has been reconstructed.

What is claimed is:

1. In a storage system having n+1 disks arranged in a RAID array, a plurality of data blocks, a plurality of parity blocks, each parity block associated with n data blocks, a plurality of status bits, each status bit associated with one of said data blocks or said parity blocks, each status bit having a first state indicating that said associated block may contain invalid information and a second state indicating that said associated block contains valid information, a method of on-line reconstruction of a new disk replacing a failed disk in said array while preserving concurrent access to said array by a user application, comprising the steps of:

detecting a failed disk in said array;

removing said failed disk from said array;

preparing a new disk by setting all status bits to said first state;

adding said new disk to said array;

systematically reconstructing data or parity blocks with associated status bits in said first state and after each reconstruction of a data block or parity block, setting said associated status bit to said second state;

continuing said systematic reconstruction until all blocks on said new disk have been reconstructed;

receiving requests to access data blocks in said new disk from said user application;

writing data to said accessed data blocks in said new disk and setting said associated status bits to said second state whereby the most active portions of said new disk are reconstructed before other portions.

2. The method as set forth in claim 1 wherein said step of systematic reconstruction comprises the steps of:

(a) locating a status bit in said first state associated with a data or parity block on said new disk;

(b) reading the corresponding data or parity blocks from surviving disks need for regeneration;

(c) regenerating data or parity information for said new disk;

(d) writing said regenerated data or parity information to a block on said new disk;

(e) setting the status bits of said block containing said regenerated information to said second state;

(f) determining if all status bits associated with a data or parity block on said new disk have been processed;

(g) if a status bit remains unprocessed then repeating steps (a) through (g);

(h) if all said status bits have been processed terminating said method.

3. In a storage system having n+1 disks arranged in a RAID array, a plurality of data blocks, a plurality of parity blocks, each parity block associated with n data blocks, and status information associated with each of said data blocks or said parity blocks indicating that said associated block may contain invalid information or indicating that said associated block contains valid information, a method of on-line reconstruction of a new disk replacing a failed disk in said array while preserving concurrent access to said array by a user application, comprising the steps of:

detecting a failed disk in said array;

removing said failed disk from said array;

preparing a new disk by setting all status information to indicate that said associated block may contain invalid information;

adding said new disk to said array;

systematically reconstructing data or parity blocks with associated status information indicating that said associated block may contain invalid information and after each reconstructing of a data block or parity block, setting said associated status information to indicate that said associated block contains valid information;

continuing said systematic reconstruction until all blocks on said new disk have been reconstructed;

receiving requests to access data blocks in said new disk from said user application;

writing data to said accessed data blocks in said new disk and setting said associated status information to indicate that said associated blocks contain valid information whereby the most active portions of said new disk are reconstructed before other portions.

4. The method as set forth in claim 3 wherein said step of systematic reconstruction comprises the steps of:

(a) locating a data or parity block on said new disk with status information indicating that said associated block may contain invalid information;

(b) reading the corresponding data or parity blocks from surviving disks need for regeneration;

(c) regenerating data or parity information for said new disk;

(d) writing said regenerated data or parity information to a block on said new disk;

(e) setting the status information of said block containing said regenerated information to indicate that said associated block contains valid information;

(f) determining if all data or parity blocks on said new disk have been processed;

(g) if a data or parity block remains unprocessed then repeating steps (a) through (g);

(h) if all said data or parity blocks have been processed terminating said method.

5. In a storage system having n+1 disks arranged in a RAID array, a plurality of data blocks, a plurality of parity blocks, each parity block associated with n data blocks, a plurality of status bits, each status bit associated with one of said data blocks or said parity blocks, each status bit having a first state indicating that said associated block may contain invalid information and a second state indicating that said associated block contains valid information, one of said disks being a new disk replacing a failed disk, said new disk having all of said status bits associated with the data and parity blocks in said first state, apparatus for on-line reconstruction of a new disk replacing a failed disk in said array while preserving concurrent access to said array by a user application comprising:

read/write control logic for providing an interrogate output signal;

a status network coupled to said read/write control logic, said status network responsive to said interrogate output signal for locating a status bit in said first state, said status network for providing a signal for identifying the data block or parity block associated with said status bit in said first state;

regeneration logic coupled to said read/write control logic, said regeneration logic responsive to said identifying signal for regenerating said identified data or parity block;

said read/write control logic coupled to said regeneration logic and providing a clear output signal, said read/write control logic for writing said data or parity block regenerated by said regeneration logic and asserting said clear output signal, said status network responsive to said clear output signal for setting said status bit associated with said regenerated data or parity block to said second state;

RAID control logic for receiving a request from said user application to access any data block on said new disk; and said read/write control logic also coupled to said RAID control logic for writing data to said accessed data block on said new disk, and, if the status bit associated with said accessed data block is in said first state, asserting said clear output signal, said status network responsive to said clear output signal for setting said status bit associated with said accessed data block to said second state.

6. In a storage system having n+1 disks arranged in a RAID array, a plurality of data blocks, a plurality of parity blocks, each parity block associated with n data blocks, one of said disks being a new disk replacing a failed disk, apparatus for on-line reconstruction of a new disk replacing a failed disk in said array while preserving concurrent access to said array by a user application comprising:

read/write control logic for providing an interrogate output signal;

a status network coupled to said read/write control logic, said status network having a plurality of status bits, each status bit associated with one of said data blocks or said parity blocks, each status bit having a first state indicating that said associated block may contain invalid information and a second state indicating that said associated block contains valid information, said status network responsive to said interrogate output signal for locating a status bit in said first state, said status network for providing a signal for identifying the data block or parity block associated with said status bit in said first state;

regeneration logic coupled to said read/write control logic, said regeneration logic responsive to said identifying signal for regenerating said identified data or parity block;

said read/write control logic coupled to said regeneration logic and providing a clear output signal, said read/write control logic for writing said data or parity block regenerated by said regeneration logic and asserting said clear output signal, said status network responsive to said clear output signal for setting said status bit associated with said regenerated data or parity block to said second state;

RAID control logic for receiving a request from said user application to access any data block on said new disk; and said read/write control logic also coupled to said RAID control logic for writing data to said accessed data block on said new disk, and, if the status bit associated with said accessed data block is in said first state, asserting said clear output signal, said status network responsive to said clear output signal for setting said status bit associated with said accessed data block to said second state.

7. A storage system as set forth in claim 6 wherein said status network comprises:

cache for storing said plurality of status bits;

status control logic responsive to said interrogate signal and coupled to said cache for locating a status bit in said first state;

set control logic coupled to said cache for providing a signal identifying the data block or parity block associated with said status bit in said first state; and clear control logic responsive to said clear output signal and coupled to said cache for setting said status bit to said second state.

* * * * *